United States Patent
Yoo et al.

(10) Patent No.: US 7,428,024 B2
(45) Date of Patent: Sep. 23, 2008

(54) ARRAY SUBSTRATE FOR LIQUID CRYSTAL DISPLAY DEVICE AND THE FABRICATION METHOD OF THE SAME

(75) Inventors: Soon-Sung Yoo, Kumi-shi (KR); Yong-Wan Kim, Kumi-shi (KR); Yu-Ho Jung, Kumi-shi (KR); Woo-Chae Lee, Kumi-shi (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 10/810,659

(22) Filed: Mar. 29, 2004

(65) Prior Publication Data

US 2004/0179143 A1 Sep. 16, 2004

Related U.S. Application Data

(62) Division of application No. 09/734,009, filed on Dec. 12, 2000, now Pat. No. 6,734,049.

(30) Foreign Application Priority Data

Dec. 16, 1999 (KR) .............................. 1999-58109

(51) Int. Cl.
*G02F 1/1343* (2006.01)
(52) U.S. Cl. .......................................... 349/38; 349/43
(58) Field of Classification Search .................. 349/38, 349/43
See application file for complete search history.

(56) References Cited

U.S. PATENT DOCUMENTS

| | | | | |
|---|---|---|---|---|
| 5,844,255 A * | 12/1998 | Suzuki et al. | ................. | 257/59 |
| 5,894,136 A * | 4/1999 | Wook | ............................ | 257/59 |
| 5,926,235 A * | 7/1999 | Han et al. | ..................... | 349/43 |
| 5,990,986 A * | 11/1999 | Song et al. | ..................... | 349/43 |
| 6,043,511 A * | 3/2000 | Kim | ............................. | 257/59 |
| 6,300,152 B1 * | 10/2001 | Kim | ............................. | 438/30 |
| 6,310,667 B1 * | 10/2001 | Nakayoshi et al. | ............ | 349/42 |
| 6,331,443 B1 * | 12/2001 | Lee et al. | ....................... | 438/30 |
| 6,762,802 B2 * | 7/2004 | Ono et al. | ..................... | 349/38 |
| 6,894,734 B1 * | 5/2005 | Ihara | ............................ | 349/38 |
| 2002/0063253 A1 * | 5/2002 | Hong et al. | .................... | 257/59 |
| 2002/0093016 A1 * | 7/2002 | Lim et al. | ...................... | 257/59 |
| 2002/0098629 A1 * | 7/2002 | Boer et al. | .................. | 438/149 |

* cited by examiner

*Primary Examiner*—Richard H Kim
(74) *Attorney, Agent, or Firm*—McKenna Long & Aldridge LLP

(57) ABSTRACT

The present invention discloses an array substrate for an active-matrix LCD device and a method of fabricating the same. The array substrate reduces the number of masks typically used in the fabrication process so that reliability is enhanced and the cost is reduced over the conventional device and method. Electric shorts caused by hillocks can be prevented or reduced by incorporating short-preventing sections between the gate line and an overlapping pixel electrode.

5 Claims, 8 Drawing Sheets

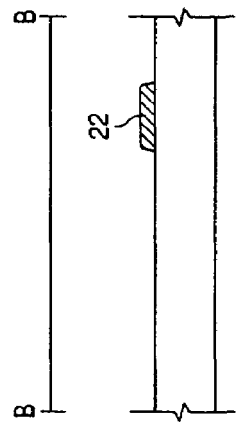
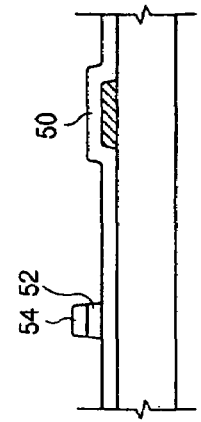
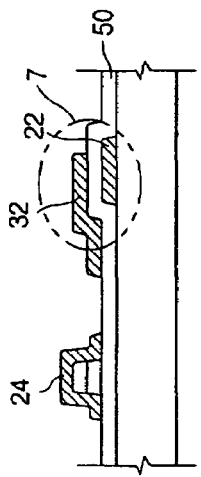
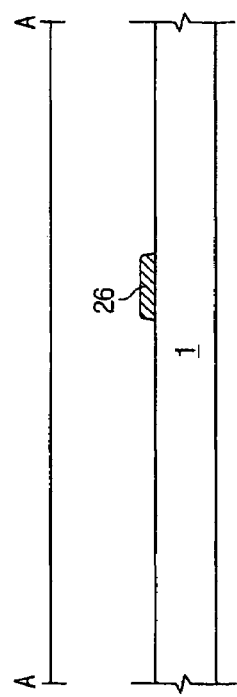
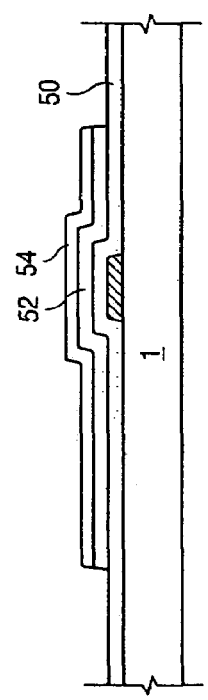
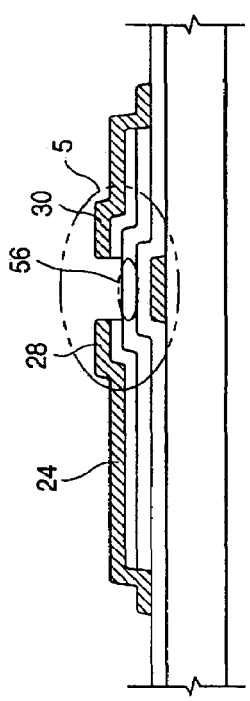

ARRAY SUBSTRATE FOR LIQUID CRYSTAL DISPLAY DEVICE AND THE FABRICATION METHOD OF THE SAME

This application is a divisional of prior application Ser. No. 09/734,009, filed Dec. 12, 2000, now U.S. Pat. No. 6,734,049.

This application claims the benefit of Korean Patent Application No. 1999-58109, filed on Dec. 16, 1999, which is hereby incorporated by reference for all purposes as if fully set forth herein.

BACKGROUND OF THE INVENTION

1. Field of the Invention

The present invention relates to an active-matrix liquid crystal display (LCD) device, and to a method of fabricating the same. More particularly it relates to an array substrate for an active-matrix LCD device having thin film transistors, and to a method of fabricating that array substrate.

2. Discussion of the Related Art

An active matrix type LCD device usually uses thin film transistors (TFTs) as switching devices. An LCD device is typically made up of two substrates having an interposed liquid crystal material. One substrate, referred to as the array substrate, includes a matrix array of TFTs and pixel electrodes. The opposing substrate, referred to as the color filter substrate, includes a light-shielding film (also known as a black matrix), a color filter, and a common electrode.

Because of its simple structure and superior quality, an inverted staggered type TFT is widely used on array substrates. The inverted, staggered type TFT can be classified into either a back-channel-etch type or an etch-stopper type. Those types are differentiated according to the methods of forming a channel in the TFT. Of the two, the back-channel-etch type has a simpler structure.

A typical array substrate manufacturing process requires repeated steps of depositing and patterning of various layers. The patterning steps use photolithography masks. Each step is facilitated by using one mask. The number of masks used in the manufacturing process is a critical factor in determining the number of patterning steps. In particular, manufacturing costs depend heavily on the number of masks used. Furthermore, the reliability of the resulting device can depend upon the number of patterning steps used.

Referring to the attached drawings, an array substrate of an LCD device that incorporates a back-channel-etching type TFT structure and that is manufactured by a conventional method will now be explained in some detail.

As shown in FIG. 1, the LCD device 20 includes an array substrate 2, a color filter substrate 4 opposing the array substrate 2, an interposed liquid crystal 10, and a sealant 6 that is formed at the periphery of the gap between the two substrates 2 and 4. The sealant 6 prevents the liquid crystal 10 from leaking out of the LCD device 20.

The array substrate 2 includes a substrate 1, a TFT 5, and a pixel electrode 14. The TFT 5 acts as a switching element for changing the orientation of the liquid crystal 10, and the pixel electrode 14 is used as a first electrode to apply electric fields across the liquid crystal 10.

The color filter substrate 4 includes a substrate 11, a color filter 8, and a common electrode 12. The color filter 8 is used for displaying colors and the common electrode 12 is used as a second electrode to apply electric fields across the liquid crystal 10.

Referring to FIG. 2, a more detailed description of the structure and operation of the array substrate 2 will be provided.

On the substrate 1, a gate line 22 is formed in a horizontal direction and a data line 24 is formed in a transverse direction. The pixel electrode 14 is formed within a rectangular area partially defined by the gate and data lines 22 and 24. Sometimes the pixel electrode 14 will overlap the gate and date lines 22 and 24. Near the crossing point of the gate and data lines 22 and 24, a portion of the gate line 22 forms a gate electrode 26. At one end of the gate line 22 is a gate pad 18 having a gate pad contact hole 21.

Near the crossing point of the gate and data lines 22 and 24, the data line 24 protrudes to form a source electrode 28. A drain electrode 30 is then formed at a position that is spaced apart from the source electrode 28. At one end of the data line 24 is a data pad 20 having a data pad contact hole 23.

Spaced apart from the drain electrode 30 and over a portion of the gate line 22 is an island-shaped capacitor electrode 32 that is formed at the same layer as the data line 24. A protruding portion of the pixel electrode 14 overlaps the capacitor electrode 32, and together with the gate line 22, forms a storage capacitor 7 that stores electric charges.

A capacitor contact hole 36 enables the capacitor electrode 32 to electrically connect to the pixel electrode 14. Another portion of the pixel electrode 14 overlaps a portion of the drain electrode 30. A drain contact hole 34 at the overlapped portion enables the pixel electrode 14 to electrically connect to the drain electrode 30.

As explained previously, the TFT 5, which includes the gate, source, and drain electrodes 26, 28 and 30, selectively applies an electric field to the liquid crystal 10 (shown in FIG. 1). In operation, if a signal is applied to the gate electrode 26 of the TFT 5, an electrical connection is established between the data line 24 and the pixel electrode 14. With the gate electrode 26 turned ON, an electric field is produced by the pixel electrode 14 in accordance with the signal applied to the data line 24 via the data pad 20.

Next, referring to FIGS. 3A to 7A and 3B to 7B, a more detailed description of the structure and the fabrication method of the TFT and the storage capacitor will be provided. FIGS. 3A to 7A illustrate sequential fabrication steps of a cross-section taken along a line "A-A" of FIG. 2, and FIGS. 3B to 7B illustrate corresponding sequential fabrication steps of a cross-section taken along a line "B-B" of FIG. 2.

As shown in FIGS. 3A and 3B, a first metallic material is deposited on a surface of the substrate 1. That metallic material is then patterned using a first mask to form the gate line 22, including the gate electrode 26. Also formed at this time is the gate pad 18 shown in FIG. 2. For the first metallic material, a highly conductive metal such as aluminum (Al), aluminum alloy, or molybdenum (Mo) is preferred.

As shown in FIGS. 4A and 4B, a first insulating material is then deposited to form a gate insulating layer 50. On the gate insulating layer 50 a semiconductor material is then deposited and doped with impurities. That semiconductor material is then patterned with a second mask to form a semiconductor layer 52 having an ohmic contact layer 54. This defines a first intermediate structure.

Then, as shown in FIGS. 5A and 5B, a second metallic material is deposited over the first intermediate structure and patterned using a third mask to form a source electrode 28, a drain electrode 30, and a data line 24. The data line 24 is connected to the source electrode 28 (FIG. 5A). At the same time, over a portion of the gate line 22, the second metallic material is used to form a capacitor electrode 32 while using the third mask (FIG. 5B).

Afterwards, a portion of the ohmic contact layer 54 is etched away to define a channel region 56 on the semiconductor layer 52 (FIG. 5A). At this point a second intermediate structure is defined. That second intermediate structure includes the TFT 5 comprised of the gate, source, and drain electrodes 26, 28, and 30, the semiconductor layer 52 having the channel region 56, and the ohmic contact layer 54.

As shown in FIGS. 6A and 6B, a second insulating material is deposited over the second intermediate structure. That second insulating material is then patterned using a fourth mask to form a passivation layer 58. The passivation layer 58, which protects the TFT 5 and the capacitor electrode 32, is beneficially comprised of inorganic-based silicon nitride ($SiN_x$), of silicon oxide ($SiO_2$), or of an organic-based benzocyclobutene (BCB). Those materials are beneficial because they exhibit high light-transmissivity, are relatively moisture-proof, and have high durability. Patterning the second insulating layer using the fourth mask also forms a data pad contact 23, a drain contact 34, and a capacitor contact hole 36. The result is a third intermediate structure.

Then, as shown in FIGS. 7A and 7B, a transparent conductive material is deposited on the third intermediate structure. That transparent conductive material is then patterned using a fifth mask to form the pixel electrode 14. The pixel electrode 14 is electrically connected to the drain electrode 30 and to the capacitor electrode 32 via the drain and capacitor contact holes 34 and 36, respectively. The transparent conductive material is beneficially made of indium tin oxide (ITO).

FIG. 8 shows the above-described fabricating process in a block diagram.

In step ST200, the substrate is cleaned to be free from surface contaminants.

In step ST210, the gate line 22, gate electrode 26, and gate pad 18 are formed by depositing the first metallic material and patterning the first metal layer using the first mask.

In step ST220, the gate insulating layer 50 is deposited and patterned using the second mask. Then, the semiconductor 52 and the ohmic contact layer 54 are formed by sequentially depositing and patterning a semiconductor layer and a doped semiconductor layer. The ohmic contact layer 54 can be formed by doping impurity ions into the semiconductor layer instead of by depositing a doped semiconductor layer.

In step ST230, the source and drain electrodes 28 and 30, the data line 24, and the capacitor electrode 32 are formed by depositing and patterning the second metallic layer using a third mask.

In step ST240, the back channel 56 is formed by etching the ohmic contact layer 54 using the source and drain electrodes as a mask.

In step ST250, a second insulating layer is deposited and the passivation layer 58, the data, the drain, and the capacitor contact holes (23, 34, and 36 respectively) are formed by patterning using a fourth mask.

In step ST260, the pixel electrode 14 is formed by depositing and patterning the transparent conductive material using a fifth mask.

The above-described conventional method of fabricating the array substrate of the LCD device employs five masks. If aluminum is used to form the gate electrode, at least two additional masks are needed to prevent hillocks that could lead to gate line defects.

A more detailed description of the hillock problem is provided with references to FIG. 9, which is an enlarged view of the storage capacitor 7 of FIG. 6B. A hillock "H" occurring on the surface of the aluminum gate electrode 22 can impact growth of the gate insulating layer 50 on the gate electrode 22. An abnormally grown insulating layer may induce a short between the gate electrode 22 and the capacitor electrode 32, thus deteriorating the display characteristics. Additional mask processes are needed for oxidizing the gate electrode 22 so as to prevent hillocks. Accordingly, at least five, and as many as seven, masking steps, are required in the conventional fabricating process of the array substrate.

As indicated above, a decrease in the number of masking steps would decrease the manufacturing costs. Furthermore, a decrease in the number of masking steps can improve the manufacturing yield.

SUMMARY OF THE INVENTION

Accordingly, the present invention is directed to an array substrate for a liquid crystal display device, and to the fabrication method of the same, that substantially obviates one or more of the problems due to limitations and disadvantages of the related art.

An object of the present invention is to provide a relatively low cost manufacturing method of the array substrate for the LCD device.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the principles of the present invention provide a method of manufacturing an array substrate of a LCD device, and an array substrate fabricated by the method. Such a method beneficially includes forming a plurality of gate lines and a plurality of gate pads on a prepared substrate by depositing a first metal layer on the substrate, and then patterning that first metal layer with a first mask such that a plurality of spaced apart, parallel gate lines are formed, wherein a gate pad is formed at an end of each gate line. That method further includes forming a gate insulating layer, a semiconductor layer, an ohmic contact layer, and a second metal layer by sequentially depositing a first insulating material, a semiconductor material, a doped semiconductor layer, and a second metallic material over the substrate. Then, the second metal layer is patterned to form a plurality of data lines, data pads, source electrodes, and drain electrodes using a second mask, wherein the data lines cross the gate lines, each data pad is positioned at an end of a corresponding data line, each source electrode is extended from a data line near the crossing point of a gate line and the data line, and the drain electrodes are spaced apart from the source electrodes. The method further includes forming a plurality of channel regions by etching away portions of the ohmic contact layer using the patterned second metal layer as a mask, wherein the channel region is defined on the semiconductor layers between the source and the drain electrodes. A second insulating layer is then deposited on the data lines, the source and the drain electrodes, and the data pads. The second insulating layer, the ohmic contact layer, and the semiconductor layer are then patterned using a third mask to form a passivation layer, wherein the passivation layer has data pad contact holes having a shape of a through hole positioned over the data pads, and drain contact holes over the drain electrodes, wherein the passivation layer covers the patterned second metal layer and a peripheral portion of the gate line. The method further includes forming a plurality of pixel electrodes, data pad electrodes, and gate pad electrodes by depositing a transparent conductive layer on the passivation layer, and patterning the transparent conductive layer using a fourth mask, wherein a portion of each pixel electrode overlaps a peripheral portion of a gate line, the pixel electrodes electrically connect with drain electrodes via the drain contact holes, wherein the data pad electrodes electrically connect with the data pads via the data pad contact holes, and wherein the gate pad electrodes electrically connect with the gate pads via the gate pad contact holes.

The principles of the present invention further provide for another method that includes the steps of a) depositing a first conducting material on a substrate; b) using a first mask to form a gate line having a gate pad at one end; c) depositing, in sequence, a first insulating layer, a semiconductor layer, an ohmic contact layer, and a second conducting material over the structure resulting from the step b); d) using a second mask to pattern the second conducting material to form a data line such that the data line crosses the gate line, and forming source and drain electrodes near the crossing point; e) defining a channel region between the source and drain electrodes by etching the ohmic contact layer using the source and drain electrodes as a mask; f) forming a passivation layer by depositing a second insulating layer over the structure resulting from the step d); g) using a third mask to form a drain contact hole to expose the drain electrode; h) depositing a transparent conductive material over the structure resulting from step g); and i) using a fourth mask to form a pixel electrode such that the pixel electrode is electrically connected to the drain electrode through the drain contact hole.

The principles of the present invention further provide for an array substrate for an active matrix type liquid crystal display device. That array substrate includes a substrate; a gate line on the substrate having a gate pad at one end of said gate line; a first insulating layer on said gate line; a semiconductor layer over a portion of said gate line; a data line over said first insulating layer that crosses said gate line, wherein said data line extends to form a source electrode, and wherein a data pad is formed at one end of said data line; a drain electrode spaced apart from said source electrode, said drain electrode also extending into a rectangular region partially defined by said gate and data lines; a passivation layer on said drain electrode, said passivation layer having a drain contact hole that exposes the drain electrode; and a pixel electrode formed over the structure and that electrically connects to said drain electrode via said drain contact hole, wherein said pixel electrode extends over a portion of said gate line as a capacitor electrode of a storage capacitor such that said storage capacitor includes said portion of said gate line, said extended portion of said pixel electrode, said first insulating layer and a short-preventing part disposed in between.

It is to be understood that both the foregoing general description and the following detailed description are exemplary and explanatory and are intended to provide further explanation of the invention as claimed.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings:

FIGS. 3A to 7A illustrate cross-sectional views of conventional fabricating steps along the line "A-A" of FIG. 2;

FIGS. 3B to 7B illustrate cross-sectional views of conventional fabricating steps along the line "B-B" of FIG. 2;

DETAILED DESCRIPTION OF THE ILLUSTRATED EMBODIMENTS

Reference will now be made in detail to illustrated embodiments of the principles of the present invention, examples of which are shown in the accompanying drawings.

Figure 10:
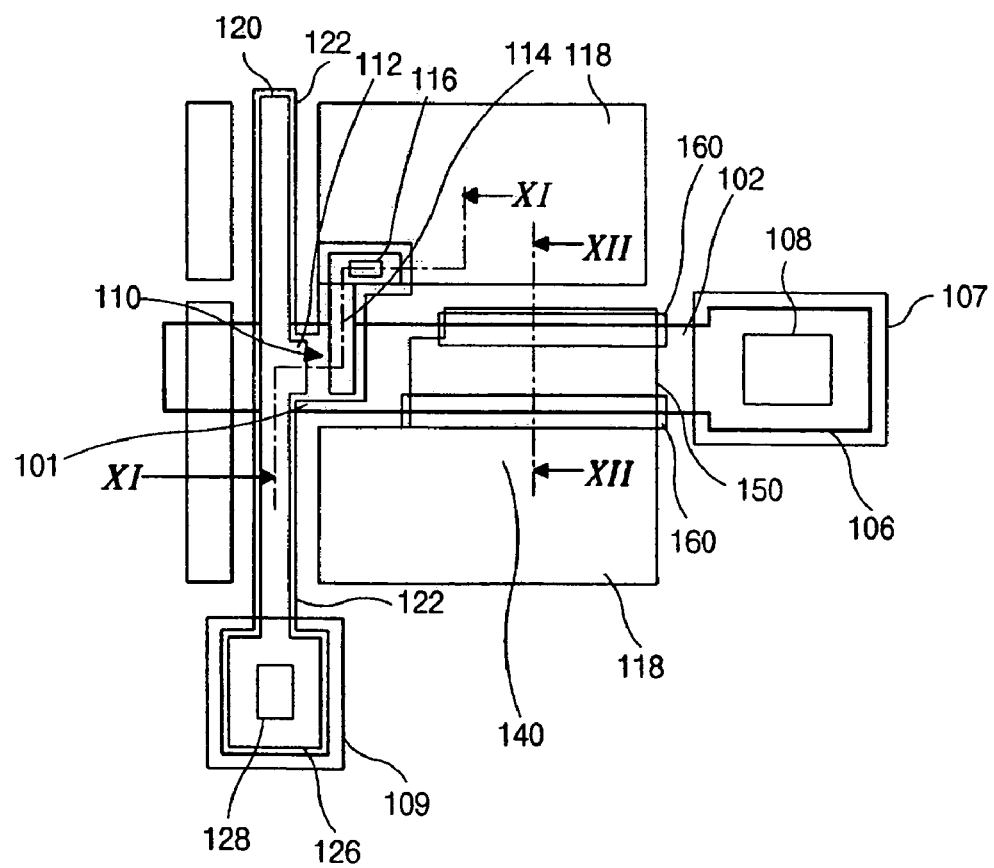
FIG. 10 is a plan view illustrating an array substrate according to an embodiment of the present invention.

Referring now to the drawings, and more particularly to FIG. 10, an array substrate according to the principles of the present invention is described.

A gate line 102 having a gate pad 106 at one end is arranged on a substrate in one direction, while a data line 120 having a data pad 126 at one end is arranged perpendicular to the gate line 102. Gate and data pad electrodes 107 and 109 are positioned over the gate and data pads 106 and 126, respectively. A pixel electrode 118 is positioned in a rectangular area that is partially defined by the gate and data lines 102 and 120.

Over the gate pad 106 is a gate electrode contact hole 108, and over the data pad 126 is a data electrode contact hole 128. The gate pad electrode 107 is electrically connected to the gate pad 106 via the gate pad contact hole 108, and the data pad electrode 109 is electrically connected to the data pad 126 via the data pad contact hole 128.

Near the crossing of the gate and data lines 102 and 120, a source electrode 112 protrudes from the data line 120. Spaced apart from the source electrode 112 is a drain electrode 114. Overlapped by the source and drain electrodes 112 and 114 is a portion of the gate line 102 that is used as a gate electrode 101. The gate electrode 101, the source electrode 112, and the drain electrode 114 are part of a thin film transistor (TFT) 110.

Over the drain electrode 114 is a drain contact hole 116. The pixel electrode 118 is electrically connected to the drain electrode 114 via the drain contact hole 116.

Spaced apart from the drain electrode 114, a portion of the pixel electrode 118 is extended to form a capacitor electrode 150. The capacitor electrode 150 overlaps a portion of the gate line 102. Between the capacitor electrode 150 and the gate line 102 are short-preventing portions 160 that act to prevent short circuits from occurring between the capacitor electrode 150 and the gate line 102. The capacitor electrode 150 and the overlapped portion of the gate line 102 make up a storage capacitor 140.

Further, a passivation layer 122 covers the data line 120, the source electrode 112, and the drain electrode 114. The passivation layer 122 can have a narrower width than the data line 120.

Hereinafter, with references to FIGS. 11A to 11D, the process of fabricating the array substrate illustrated in FIG. 10 will be explained in some detail.

Figure 11A:
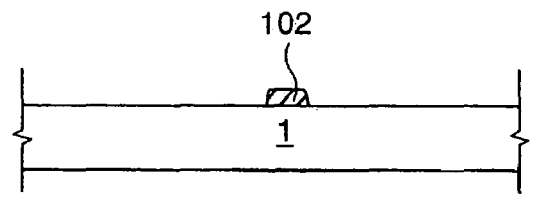
FIGS. 11A to 11D illustrate a sequence of cross-sectional views taken along a line XI-XI of FIG. 10 during the fabrication of the array substrate.

As shown in FIG. 11A, a first metallic material is deposited on a surface of a substrate 1. That metallic material is then patterned using a first mask to form the gate line 102 having the gate pad 106 (not shown in FIGS. 11A-11D) at one end. A portion of the gate line 102 is used as the gate electrode 101, thereby defining a fourth intermediate structure. The first metallic material can include molybdenum (Mo), Chromium (Cr), and/or aluminum-neodymium-molybdenum alloy.

Figure 11B:
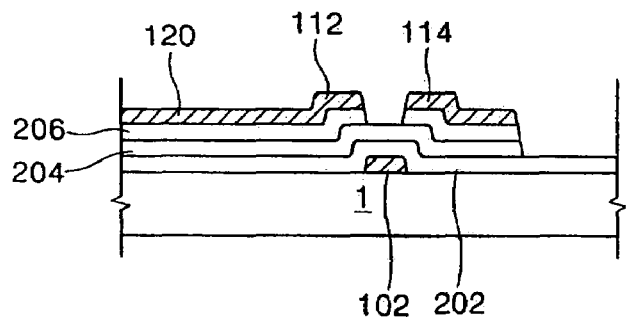

Next, as shown in FIG. 11B, on the fourth intermediate structure, a first insulating material, a semiconductor material, a doped semiconductor material, and a second metallic material are sequentially deposited to form a gate insulating layer 202, the semiconductor layer 204, the ohmic contact layer 206, and the second metal layer. Alternatively, the ohmic contact layer 206 can be formed by doping ions on the semiconductor layer 204. The second metal layer is then patterned with a second mask to form the source electrode 112, the drain electrode 114, and the data line 120. Afterwards, the ohmic contact layer 206 is etched using the patterned second metal layer as a mask to form a channel region 208, thereby defining a fifth intermediate structure. When patterned with the second mask, the overall portions of the ohmic contact layer 206 and the semiconductor layer 204, except for portions under the second mask, are etched away.

Figure 11C:
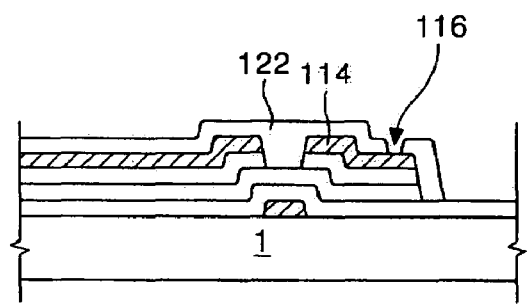

At this point, the gate insulating layer 202 protects the gate line 102 and the gate pad 106. Next, as shown in FIG. 11C, a second insulating material is deposited over the surface of the fifth intermediate structure to form the passivation layer 122. That passivation layer is then patterned using a third mask to form a drain contact hole 116, thereby defining a sixth intermediate structure.

Figure 11D:
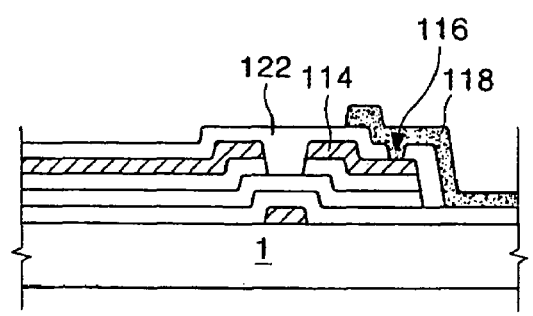

Finally, as shown in FIG. 11D, a transparent conductive material is deposited over the surface of the sixth intermediate structure. That transparent conductive material is then patterned using a fourth mask to form the pixel electrode 118. At this time, the gate pad electrode 107 that contacts the gate pad 106 via the gate pad contact hole 108 is also formed of the transparent conductive material (see FIG. 10). The transparent conductive material is preferably indium tin oxide (ITO) or indium zinc oxide (IZO).

Figure 12A:
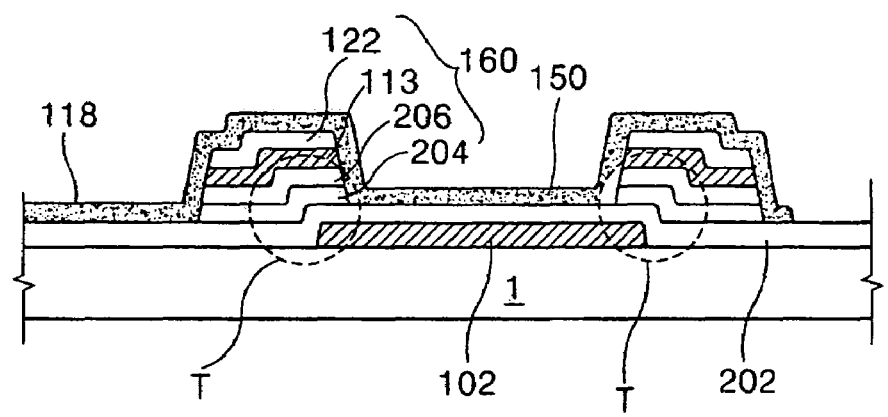
FIG. 12A is a cross-sectional view taken along the line XII-XII of FIG. 10.

Now, referring to FIG. 12, the structure of the storage capacitor 140 (shown in FIG. 10) will be explained. After the passivation layer 122 is formed using the third mask, portions of the ohmic contact layer 206 and the semiconductor layer 204 over the gate line are etched away, except for short-preventing regions 160. As mentioned above, the first insulating layer 202 protects the gate line 102.

Then, after the transparent conductive material is deposited and patterned using the fourth mask, the capacitor electrode 150 is formed. The capacitor electrode 150 extends from the pixel electrode 118 and overlaps a portion of the gate line 102 with the first insulating layer 202 being interposed. The capacitor electrode 150, the overlapped portion of the gate line 102, and the first insulating layer 202 form the storage capacitor 140.

The short-preventing portions 160 are positioned at the stepped portion "T" between the stepped end of the gate line 102 and the step of the capacitor electrode 150. The short-preventing portions 160 prevent short circuits from occurring between the capacitor electrode 150 and the gate line 102. Portions of the passivation layer 122, the second metal layer 113, the first insulating layer 202, the semiconductor layer 204, and the ohmic contact layer 206 make up the short-preventing portion 160.

Figure 1:
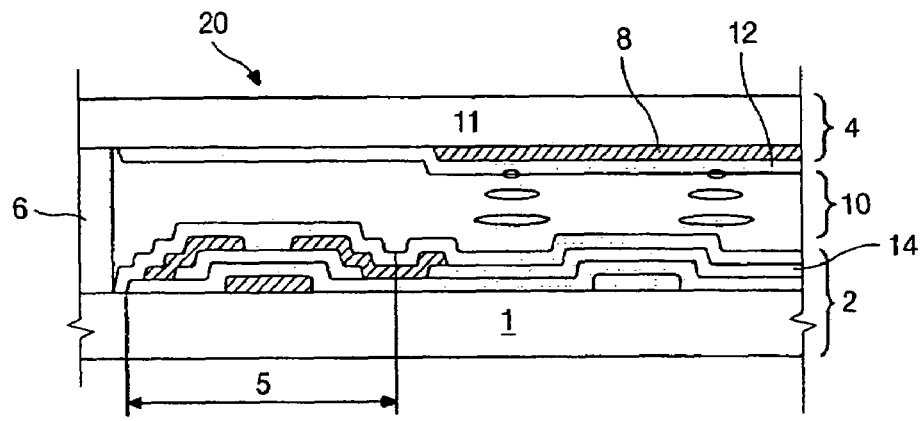
FIG. 1 is a schematic cross-sectional view of a conventional LCD device.
Figure 2:
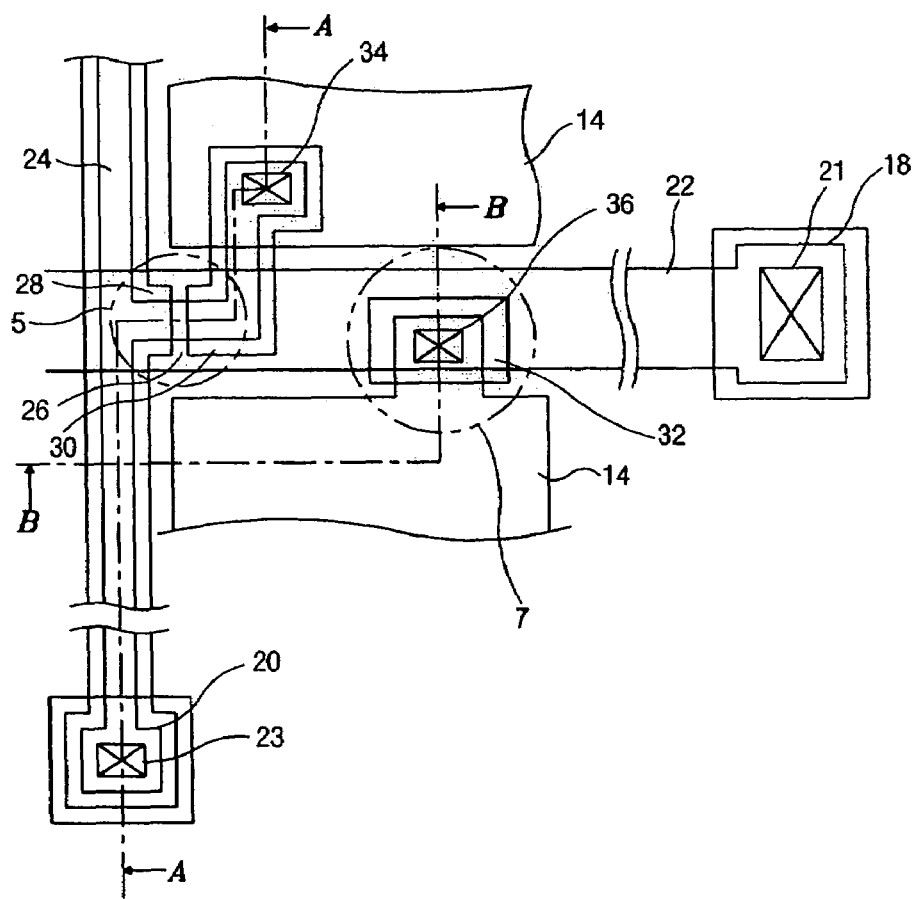
FIG. 2 is a plan view illustrating a portion of an array substrate of the conventional LCD device.
Figure 6A:
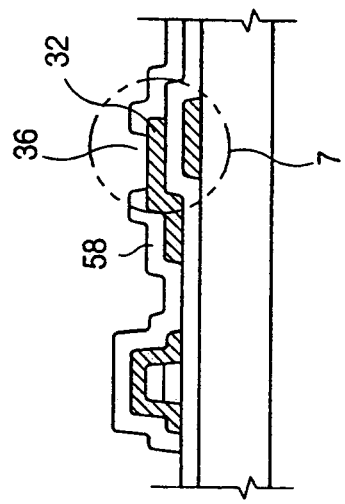
Figure 6B:
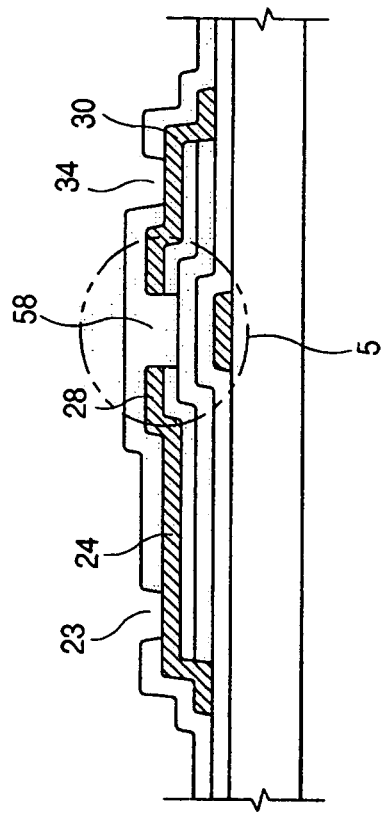
Figure 7A:
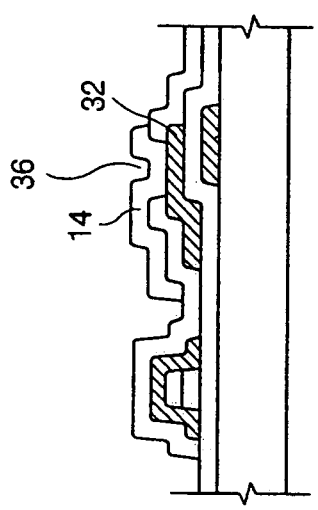
Figure 7B:
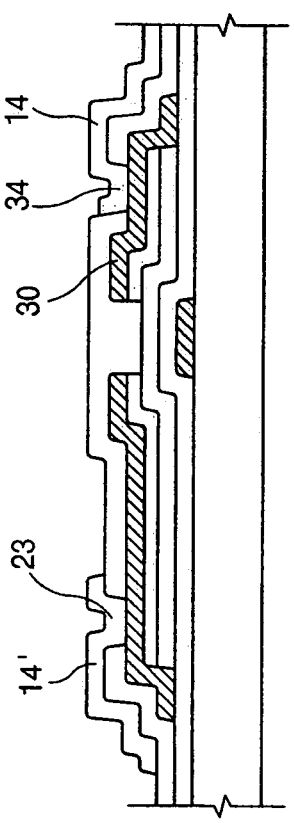
Figure 8:
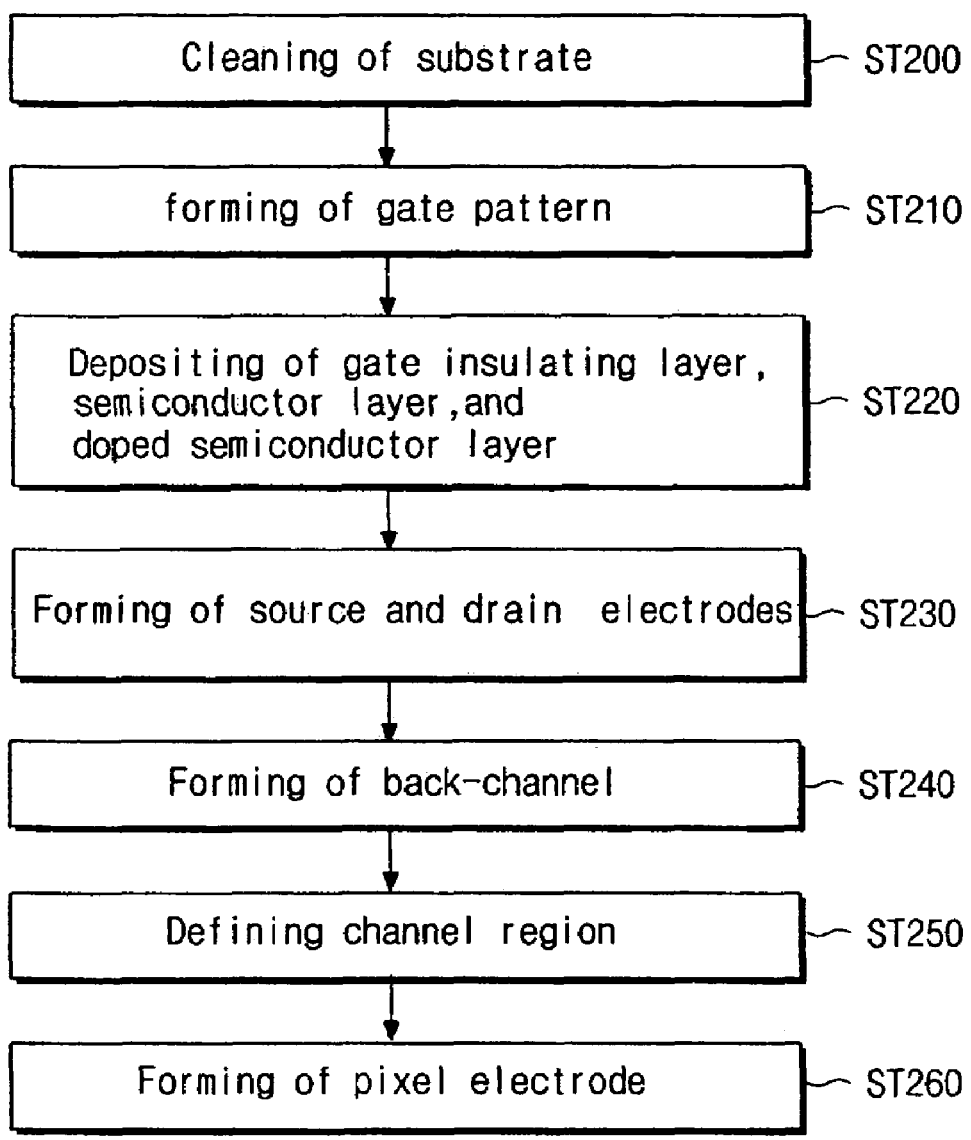
FIG. 8 is a block diagram illustrating the sequence of conventionally fabricating an array substrate.
Figure 9:
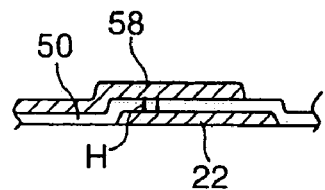
FIG. 9 is an enlarged view of a storage capacitor having a hillock.
Figure 12B:
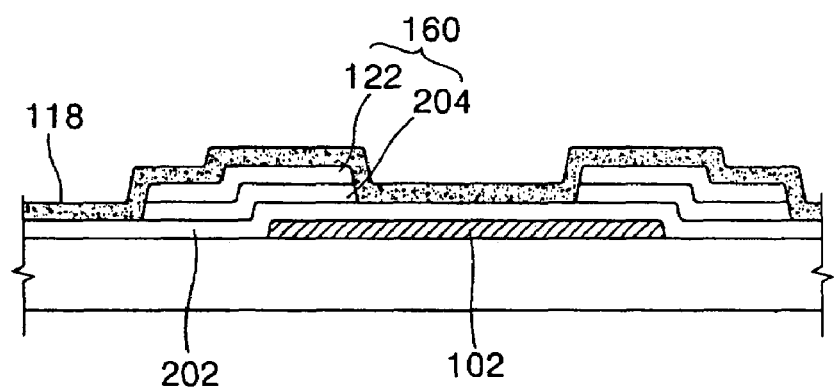
FIG. 12B is a cross-sectional view taken along the line XII-XII of FIG. 10 according to a modification of FIG. 12A.

Referring to FIG. 12B, the second metal layer 113 of the short-preventing portion 160 can be omitted. In this case, the short-preventing portion 160 includes the semiconductor layer 204 and the passivation layer 122. The ohmic contact layer 206 does not exist, since the second metal layer 113 is used to etch the ohmic contact layer 206 (see FIG. 1B).

Figure 13:
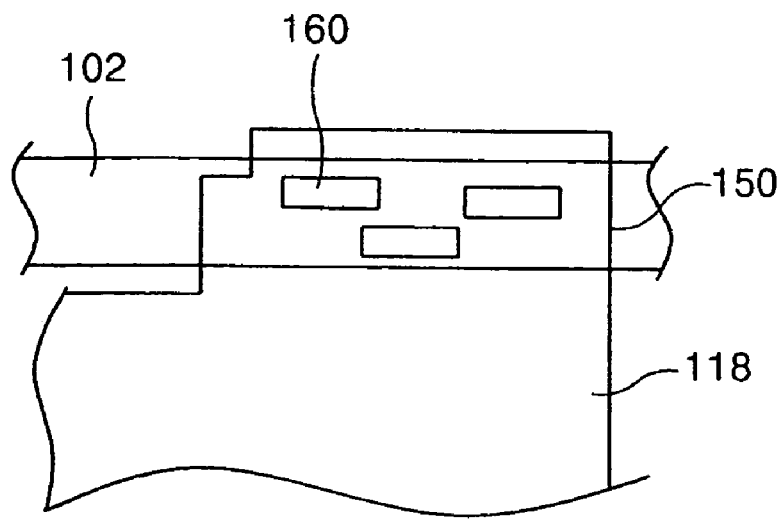
FIGS. 13 and 14 are plan views of a portion of a storage capacitors according to modified examples of FIG. 10.
Figure 14:
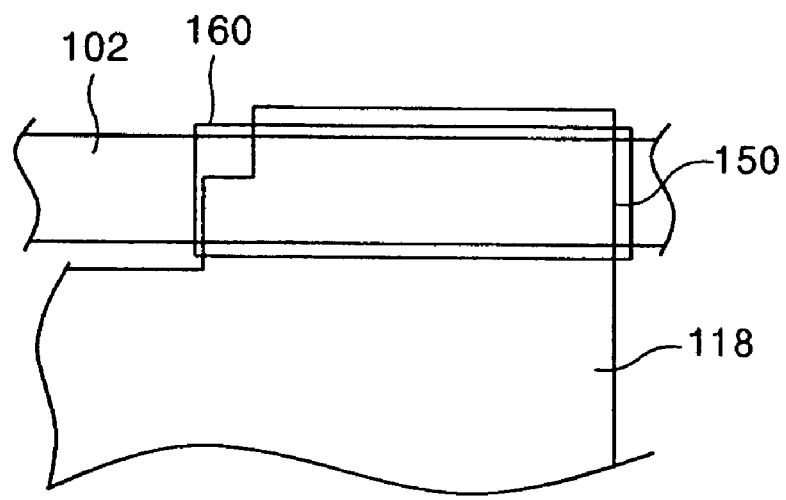

FIGS. 13 and 14 show modified examples of the short-preventing regions 160. As shown in FIG. 13, the short-preventing regions 160 can be positioned scattered around the overlapped portion of the gate line 102. Alternatively, as shown in FIG. 14, the shorting-preventing regions 160 can cover the whole width of the overlapped portion of the gate line 102.

As described above, the fabricating method according to the preferred embodiment of the present invention employs only four masks, and therefore can be a less expensive and a more reliable method of manufacturing an active-matrix LCD device. Also, by providing short-preventing regions or bars on the gate line 102 shorts caused by hillocks can be prevented or reduced.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An array substrate for an active matrix type liquid crystal display (LCD) device, comprising:
   a substrate;
   a gate line on said substrate, wherein said gate line includes a gate pad;
   a first insulating layer on said gate line and said substrate;
   a semiconductor layer on said first insulating layer and over a portion of said gate line;
   a data line over said first insulating layer and that crosses said gate line, said data line including a protruding portion that projects in a direction of said semiconductor layer and that forms a source electrode, wherein an end portion of the semiconductor layer under the data line is substantially a same width as an end portion of the data line, wherein said data line further includes a data pad;
   a drain electrode spaced apart from said source electrode and extending into a rectangular region partially defined by said gate and data lines;
   a passivation layer on said drain electrode, said passivation layer having a drain contact hole that exposes said drain electrode; and
   a pixel electrode formed over the passivation layer, said pixel electrode electrically connecting to said drain electrode via said drain contact hole, wherein said pixel electrode extends over a portion of said gate line so as to form a storage capacitor comprised of a capacitor electrode extending from the pixel electrode, said gate line, and said first insulating layer therebetween, wherein said storage capacitor further includes a short-preventing part disposed between said pixel electrode and said gate line,
   wherein the short-preventing part has a stepped portion that overlaps a stepped end portion of the gate line, and wherein said short-preventing part includes said semiconductor layer and said passivation layer.

2. The array substrate of claim 1, wherein said short-preventing part further includes an ohmic contact layer, and a conducting material between said semiconductor layer and said passivation layer.

3. An array substrate for an active matrix type liquid crystal display (LCD) device, comprising:
   a substrate;

a gate line on said substrate, wherein said gate line includes a gate pad;

a first insulating layer on said gate line and said substrate;

a semiconductor layer on said first insulating layer and over a portion of said gate line;

a data line over said first insulating layer and that crosses said gate line, said data line including a protruding portion that projects in a direction of said semiconductor layer and that forms a source electrode, wherein an end portion of the semiconductor layer under the data line is substantially a same width as an end portion of the data line, wherein said data line further includes a data pad;

a drain electrode spaced apart from said source electrode and extending into a rectangular region partially defined by said gate and data lines;

a passivation layer on said drain electrode, said passivation layer having a drain contact hole that exposes said drain electrode; and a pixel electrode formed over the passivation layer, said pixel electrode electrically connecting to said drain electrode via said drain contact hole, wherein said pixel electrode extends over a portion of said gate line so as to form a storage capacitor comprised of a capacitor electrode extending from the pixel electrode, said gate line, and said first insulating layer therebetween, wherein said storage capacitor further includes a short-preventing part disposed between said pixel electrode and said gate line, and wherein said short-preventing part includes said semiconductor layer and said passivation layer.

4. The array substrate of claim 3, wherein the short-preventing part is scattered around the overlapped portion of the gate line.

5. The array substrate of claim 3, wherein the short-preventing part covers a whole width of the gate line.

* * * * *